(12) United States Patent
Kwack et al.

(10) Patent No.: US 8,030,841 B2
(45) Date of Patent: Oct. 4, 2011

(54) ORGANIC LIGHT EMITTING DISPLAY DEVICE

(75) Inventors: Jin-Ho Kwack, Suwon-si (KR);
Dong-Won Han, Suwon-si (KR);
Kyu-Sung Lee, Suwon-si (KR); Hyo-Jin Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 178 days.

(21) Appl. No.: 12/378,397

(22) Filed: Feb. 13, 2009

(65) Prior Publication Data
US 2009/0267487 A1 Oct. 29, 2009

(30) Foreign Application Priority Data

Apr. 24, 2008 (KR) .................. 10-2008-0038252

(51) Int. Cl.
*H00B 33/00* (2006.01)
(52) U.S. Cl. .................. 313/504; 313/506; 313/512
(58) Field of Classification Search .................. None
See application file for complete search history.

(56) References Cited

U.S. PATENT DOCUMENTS

| 7,187,119 | B2 * | 3/2007 | Weaver | 313/504 |
| 7,274,423 | B2 * | 9/2007 | Kobayashi | 349/153 |
| 7,355,341 | B2 * | 4/2008 | Yoshizawa | 313/506 |
| 7,612,498 | B2 * | 11/2009 | Sano et al. | 313/506 |
| 2004/0232832 | A1 * | 11/2004 | Kubota | 313/512 |
| 2005/0017633 | A1 * | 1/2005 | Miyadera | 313/512 |
| 2007/0194711 | A1 * | 8/2007 | Matsuura et al. | 313/512 |
| 2008/0018230 | A1 * | 1/2008 | Yamada et al. | 313/498 |
| 2009/0174311 | A1 * | 7/2009 | Patel et al. | 313/504 |

FOREIGN PATENT DOCUMENTS

KR 10-2005-0051570 6/2005
KR 10-0796129 B1 1/2008

* cited by examiner

*Primary Examiner* — Ashok Patel
(74) *Attorney, Agent, or Firm* — Knobbe Martens Olson & Bear, LLP

(57) ABSTRACT

An organic light emitting display device includes a substrate; an organic light emitting unit formed on the substrate; and a sealing unit which seals the organic light emitting unit, wherein the sealing unit is formed by alternately stacking at least one first thin film and at least one second thin film, the first thin film being formed to surround a portion of the second thin film.

13 Claims, 2 Drawing Sheets

ORGANIC LIGHT EMITTING DISPLAY DEVICE

CROSS-REFERENCE TO RELATED APPLICATION

This application claims the benefit of Korean Patent Application No. 10-2008-0038252, filed on Apr. 24, 2008 in the Korean Intellectual Property Office, the disclosure of which is incorporated herein by reference in its entirety.

BACKGROUND

1. Technical Field

The present disclosure relates to an organic light emitting display device, and more particularly, to an organic light emitting display device capable of preventing penetration of vapor such as moisture or oxygen.

2. Description of the Related Art

Organic light emitting display (OLED) devices using OLED elements typically have faster response speeds than liquid crystal display (LCD) devices, which are currently in wide commercial use, and thus, can provide excellent images of rapid motion. Furthermore, OLED devices are emissive, have wide viewing angles, and have high brightness. Thus, OLED devices are expected to be next generation display devices.

An OLED element includes a pixel electrode and a facing electrode facing each other, and a light emitting layer including an organic material interposed between the pixel electrode and the facing electrode. The OLED element is sensitive to moisture, oxygen, and light. Accordingly, if the OLED element is exposed to moisture, oxygen, and light, the OLED element can be easily degraded. In addition, when moisture or oxygen diffuses into and entered into an organic material layer, an electrochemical charge transfer reaction occurs on the interface between the electrode and the organic material layer, thereby generating an oxide. Also, the oxide separates the organic material layer and the pixel electrode or the facing electrode, causing a phenomenon such as dark spot, thereby reducing the life of the OLED element. Since the OLED element has a relatively low threshold for thermal damage, when temperature increases to from about 30° C. to about 60° C., the life of the OLED element is shortened by approximately 20 times. Therefore, a sealing technology is generally used in the OLED element to prevent external moisture, oxygen, and light from entering the OLED element.

SUMMARY OF THE INVENTION

Some embodiments provide an organic light emitting display (OLED) device capable of preventing penetration of vapor such as moisture or oxygen from the outside.

Some embodiments provide an organic light emitting display with improved resistance to damage and/or infiltration by water vapor and/or oxygen. Embodiments of the organic light emitting display comprise a substrate, an organic light emitting unit disposed on the substrate, and a sealing unit disposed on the organic light emitting unit, which together with the substrate, encapsulate the organic light emitting unit. The sealing unit comprises a first set of films comprising at least one first thin film, and a second set of films comprising at least one second thin film. The thin films of the first set of films and the second set of films alternate or are interleaved. In some embodiments, a first thin film covers and surrounds a second thin film. In some embodiments, the second thin film is disposed over and covers the organic display unit. Some embodiments further comprise at least one getter layer disposed on a portion of a first thin film that is substantially not over the organic light emitting unit.

Accordingly an aspect provides an organic light emitting display device including: a substrate; an organic light emitting unit formed on the substrate; and a sealing unit which seals the organic light emitting unit, wherein the sealing unit is formed by alternately stacking at least one first thin film and at least one second thin film, the first thin film being formed to surround a portion of the second thin film.

The first thin film may be formed to be wider than the second thin film.

Each of the stacked first thin film may be formed to have the same width.

Each of the stacked second thin film may be formed to have the same width.

The first thin film may be formed of an inorganic material.

The second thin film may be formed of an organic material.

Another aspect provides an organic light emitting display device including: a substrate; an organic light emitting unit formed on the substrate; a sealing unit which seals the organic light emitting unit, wherein the sealing unit is formed by alternately stacking at least one first thin film and at least one second thin film, the first thin film being formed to surround a portion of the second thin film; and a getter layer formed on the first thin film, instead of forming on a region corresponding to the upper portion of the organic light emitting unit.

The getter layer may be formed of a reactive metal.

The getter layer may be formed of metal oxide.

The first thin film may be formed to be wider than the second thin film.

Each of the stacked first thin film may be formed to have the same width.

Each of the stacked second thin film may be formed to have the same width.

The first thin film may be formed of an inorganic material.

The second thin film may be formed of an organic material.

Some embodiments provide an organic light emitting display device comprising: a substrate; an organic light emitting unit disposed on the substrate; and a sealing unit disposed over the organic light emitting unit and at least a portion of the substrate, thereby sealing the organic light emitting unit therein, wherein the sealing unit comprises at least one first thin film and at least one second thin film alternately stacked, the first thin film surrounding at least a portion of the second thin film.

In some embodiments, the at least one first thin film is wider than the at least one second thin film.

Some embodiments comprise a plurality of stacked first thin films, wherein each of the stacked first thin films has substantially the same width. Some embodiments comprise a plurality of stacked second thin films, wherein each of the stacked second thin films has substantially the same width.

In some embodiments, the at least one first thin film comprises an inorganic material. In some embodiments, the at least one second thin film comprises an organic material.

Some embodiments further comprise a getter layer disposed on the at least one first thin film, wherein the getter layer is substantially not disposed over the organic light emitting unit. In some embodiments, the getter layer comprises a reactive metal. In some embodiments, the getter layer comprises metal oxide.

BRIEF DESCRIPTION OF THE DRAWINGS

The above and other features and advantages will become more apparent in the following detailed description of exemplary embodiments with reference to the attached drawings in which.

DETAILED DESCRIPTION OF CERTAIN EMBODIMENTS

Figure 1:
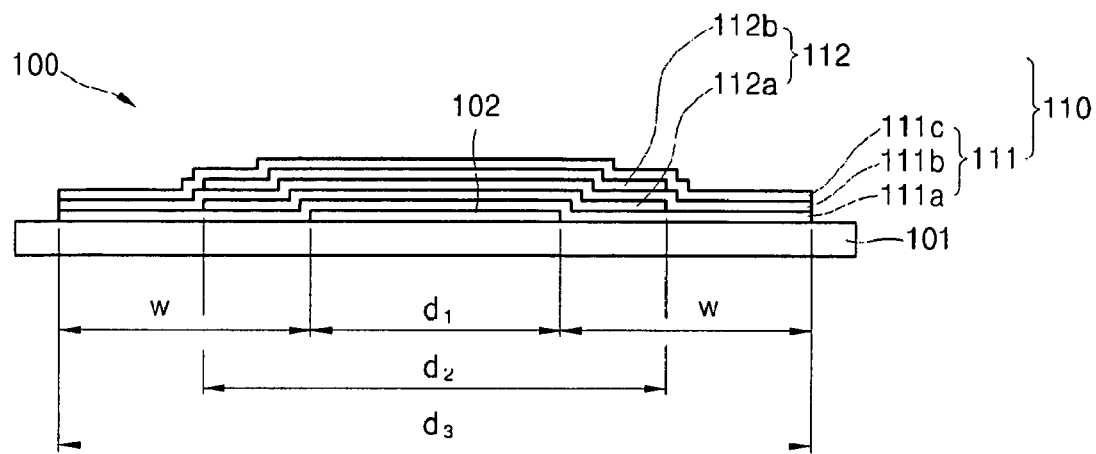
FIG. 1 is a sectional diagram schematically illustrating an embodiment of an organic light emitting display device.

Hereinafter, certain embodiments and features thereof will be described more fully with reference to the accompanying drawings, in which exemplary embodiments are shown. The disclosure may, however, be embodied in many different forms and should not be construed as being limited to the embodiments set forth herein; rather, these embodiments are provided so that this disclosure will be thorough and complete, and will fully convey the concepts thereof to those skilled in the art. In the drawings, like reference numerals denote like elements, and the sizes and thicknesses of layers and regions are exaggerated for clarity.

Figure 2:
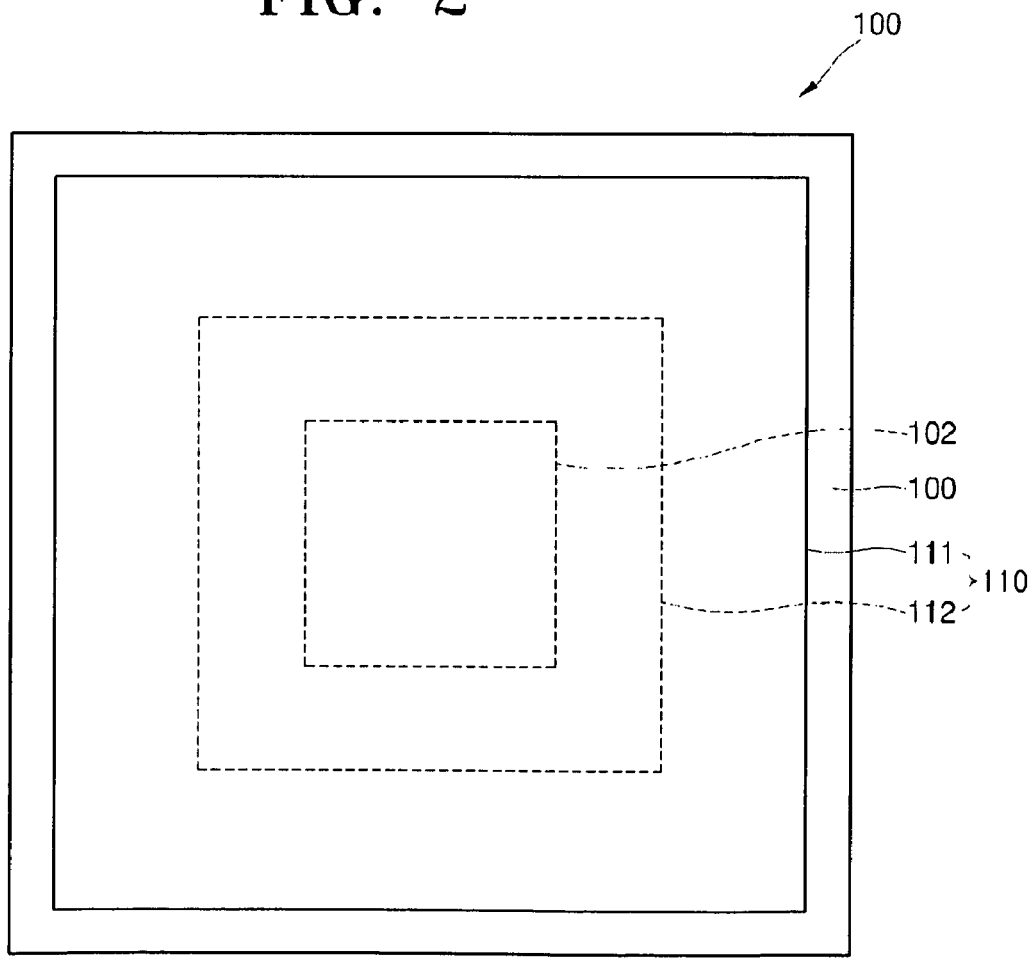
FIG. 2 is a perspective plan view schematically illustrating the organic light emitting display device of FIG. 1.

FIG. 1 is a cross-sectional diagram schematically illustrating an embodiment of an organic light emitting display device 100, and FIG. 2 is a perspective plan view schematically illustrating the organic light emitting display device 100 of FIG. 1.

Referring to FIGS. 1 and 2, the organic light emitting display device 100 includes a substrate 101, an organic light emitting unit 102, and a sealing unit 110. The organic light emitting unit 102 formed of an organic light emitting element is disposed on the substrate 101. The substrate 101 may comprise glass or plastic, such as acrylic. The substrate 101 is not limited thereto and may comprise metal. In addition, a buffer layer (not shown) may be further disposed on the substrate 101.

The organic light emitting unit 102 may further include a plurality of organic light emitting elements. The organic light emitting elements of the organic light emitting unit 102 includes a pixel electrode and a facing electrode facing each other, and an intermediate layer including a light emitting layer interposed between the pixel electrode and the facing electrode. The pixel electrode may be a transparent electrode or a reflection electrode. If the pixel electrode is a transparent electrode, the pixel electrode can comprise ITO, IZO, ZnO, or $In_2O_3$, and if the pixel electrode is a reflection electrode, the pixel electrode can include a reflection film formed of Ag, Mg, Al, Pt, Pd, Au, Ni, Nd, Ir, Cr, or a compound thereof and a film comprising ITO, IZO, ZnO, or $In_2O_3$ disposed on the reflection film. The facing electrode can also be a transparent electrode or a reflection electrode. If the facing electrode is a transparent electrode, the facing electrode can include a film comprising Li, Ca, LiF/Ca, LiF/Al, Al, Mg, or a compound thereof facing the intermediate layer and interposed between the pixel electrode and the facing electrode, and an auxiliary electrode or a bus electrode line disposed on the film, comprising the transparent electrode material, such as ITO, IZO, ZnO, or $In_2O_3$. If the facing electrode is a reflection electrode, the facing electrode can comprise Li, Ca, LiF/Ca, LiF/Al, Al, Mg, or a compound thereof. The intermediate layer interposed between the pixel electrode and the facing electrode can comprise a lower molecular weight organic material or a polymer organic material. If the intermediate layer is formed of a lower molecular weight organic material, the intermediate layer may comprise a stack comprising a hole injection layer (HIL), a hole transport layer (HTL), an emission layer (EML), an electron transport layer (ETL), or an electron injection layer (EIL) in a single structure or a composite structure, and may comprise various organic materials such as copper phthalocyanine (CuPc), N,N'-di(naphthalene-1-yl)-N,N'-diphenylbenzidine (NPB), or tris-8-hydroxyquinoline aluminum ($Alq_3$). The intermediate layer comprising a lower molecular weight organic material may be formed by a vacuum evaporation method using masks. If the intermediate layer comprises a polymer organic material, the intermediate layer may comprise an HTL and an EML, in which the HTL can comprise a polymer organic material such as poly-(2,4)-ethylene-dihydroxy thiophene (PEDOT), and the EML can comprise a polymer organic material such as poly-phenylenevinylene (PPV), or polyfluorene.

The sealing unit 110 seals the organic light emitting unit 102. The sealing unit 110 may be formed by alternately stacking a first thin film 111 and a second thin film 112, the first thin film 111 comprising separate films 111a, 111b, and 111c and the second thin film 112 comprising separate films 112a and 112b. The first thin film 111 may surround a portion of the second thin film 112. That is, the second thin films 112a and 112b are respectively interposed between the first thin films 111a, 111b, and 111c and the second thin films 112a and 112b are completely surrounded by the first thin films 111a, 111b, and 111c. Referring to FIGS. 1 and 2, the first thin film 111a seals the organic light emitting unit 102. The second thin film 112a is formed on the first thin film 111a. The second thin film 112a completely covers a region corresponding to the upper portion of the organic light emitting unit 102 and covers a portion of the first thin film 111a. The width d2 of the second thin film 112a is greater than a width d1 of the organic light emitting unit 102 and is smaller than a width d3 of the first thin film 111a.

The first thin film 111b completely covers the second thin film 112a. In addition, the second thin film 112b is disposed on the first thin film 111b. The second thin film 112b completely covers the organic light emitting unit 102 and covers a portion of the first thin film 111b. The first thin film 111c completely covers the second thin film 112b.

The sealing unit 110 may comprise at least two thin films 111 and 112, and the total number of the thin films 111a, 111b, 111c, 112a, and 112b forming the sealing unit 110 is an odd number. The thin film that directly covers the organic light emitting unit 102 is the first thin film 111a. The first thin film 111a is disposed on the organic light emitting unit 102, and the first thin film 111 and the second thin film 112 are alternately stacked, so that only first thin film is disposed on the most outer portion of the organic light emitting unit 102.

The first thin films 111a, 111b, and 111c may be formed by using various general methods of forming a thin film, for example, sputtering, chemical vapor deposition (CVD), plasma enhanced chemical vapor deposition (PECVD), and/or plasma enhanced chemical vapor deposition (PECVD). In some embodiments, each of the first thin films is independently from about 0.02 μm to about 0.2 μm thick.

When the first thin films 111a, 111b, and 111c are formed by using above methods, shadow masks each having the same size may be used. That is, one shadow mask may be used to form the plurality of the first thin films 111a, 111b, and 111c. Thus, the sizes, that is, the widths, of the first thin films 111a, 111b, and 111c are all the same. Since one shadow mask is used to form the plurality of the first thin films 111a, 111b, and 111c, a manufacturing cost of the organic light emitting display device 100 is reduced. Moreover, since one shadow mask is used to form the stack of the plurality of the first thin films 111a, 111b, and 111c, an align margin of each of the first thin films 111a, 111b, and 111c is reduced and thus a dead space w over which the sealing unit 110 covers a region other than the organic light emitting unit 102 may be reduced.

The first thin film 111 may comprise inorganic materials, for example, metal oxide, metal nitride, metal oxynitride, and/or metal carbide. The first thin film 111 comprising an inorganic material prevents gas, such as oxygen and moisture, from contacting the organic light emitting unit 102. As described above, the first thin film 111 completely seals the organic light emitting unit 102 and thus moisture or oxygen is prevented from penetrating from the outside, thereby protecting the organic light emitting unit 102.

The second thin films 112a and 112b may be formed by using various general methods of forming a thin film, for example, sputtering, CVD, PECVD, and/or PECVD, as for the first thin films 111a, 111b, and 111c. In some embodiments, each of the second thin films is independently from about 0.1 μm to about 2 μm thick.

The plurality of the second thin films 112a and 112b may be formed by using one shadow mask. Accordingly, both the second thin films 112a and 112b have the same width d2. As described above, since one shadow mask is used to form the plurality of the second thin films 112a and 112b, a manufacturing cost of the organic light emitting display device 100 is reduced.

The second thin film 112 may comprise an organic material, for example, acrylic resin. The second thin films 112a and 112b planarize the surfaces of the first thin films 111a and 111b disposed under the second thin films 112a and 112b.

A condition of the surface on which the second thin film 112 is formed is important when the second thin film 112 comprises an organic material. When the second thin film 112 comprising an organic material covers the first thin film 111, a portion of the second thin film 112 is disposed on the substrate 101 and other portion of the second thin film 112 is disposed on the first thin film 111. Since the second thin film 112 disposed on the substrate 101 and the second thin film 112 disposed on the first thin film 111 are supported on different surfaces, a minute gap may exist between the second thin film 112 and the substrate 101, and/or between the second thin film 112 and the first thin film 111 through which external moisture or oxygen may penetrate into the organic light emitting unit 102, thereby damaging the organic light emitting unit 102. However, according to one embodiment, the second thin film 112 is surrounded by the first thin film 111, and thus, the entire second thin film 112 may have a uniform foundation.

Figure 3:
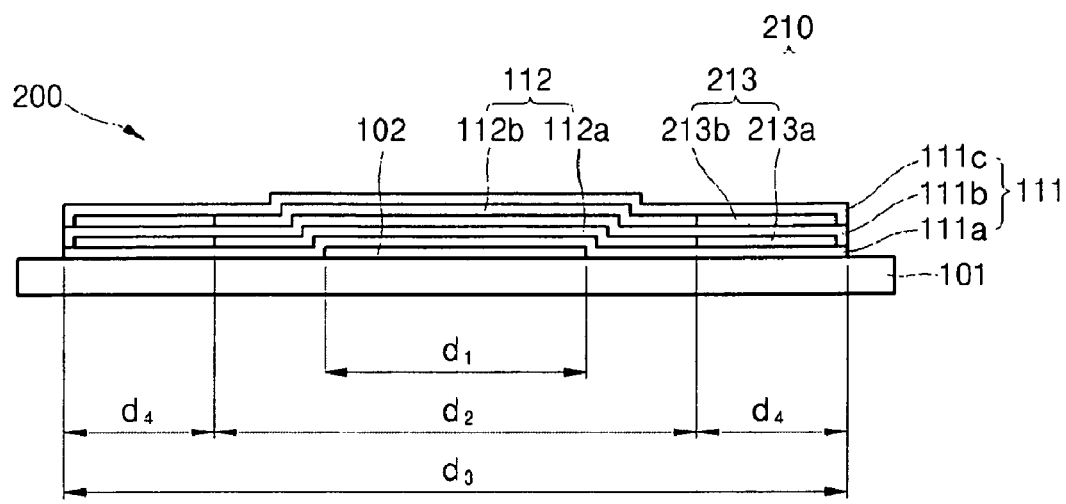
FIG. 3 is a sectional diagram schematically illustrating another embodiment of an organic light emitting display device.
Figure 4:
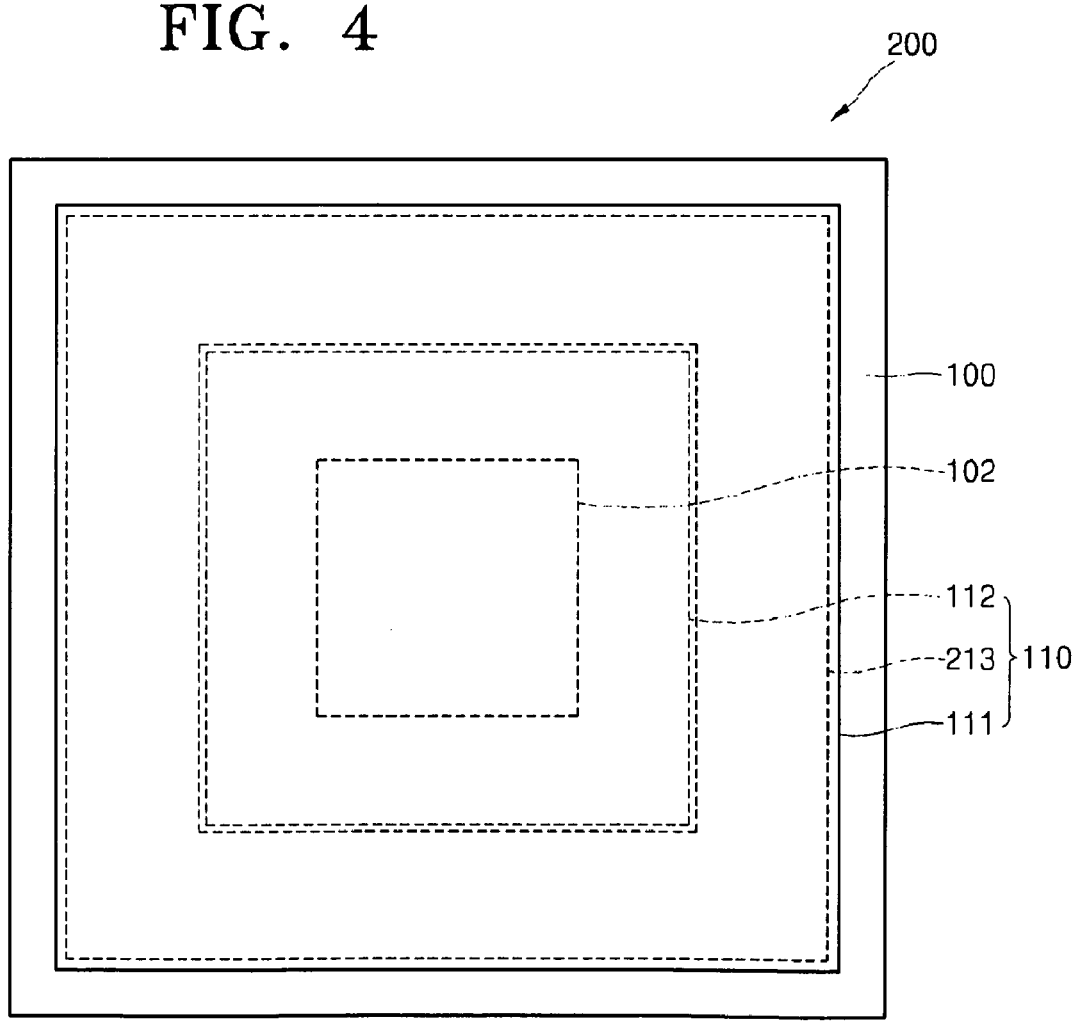
FIG. 4 is a perspective plan view schematically illustrating the organic light emitting display device of FIG. 3.

FIG. 3 is a cross-sectional diagram schematically illustrating a another embodiment of n organic light emitting display device 200; and FIG. 4 is a perspective plan view schematically illustrating the organic light emitting display device 200 of FIG. 3.

The organic light emitting display device 200 illustrated in FIGS. 3 and 4 differs from the organic light emitting display device 100 illustrated in FIGS. 1 and 2, further including a getter layer 213. In other words, the substrate 101, the organic light emitting unit 102, the first thin film 111, and the second thin film 112 included in the organic light emitting display device 200 of FIGS. 3 and 4 are the same or similar to those of the organic light emitting display device 100 described above. Accordingly, the detailed description thereof is omitted here and the getter layer 213 is described below.

The getter layer 213, which includes separate layers 213a and 213b, is interposed between the first thin film 111 and the second thin film 112, and is not disposed over the upper portion of the organic light emitting unit 102. After the second thin film 112a is formed on the first thin film 111a, the getter layer 213a is formed on a region d4 over which the second thin film 112a is not formed on the first thin film 111a. The first thin film 111b covers the second thin film 112a and the getter layer 213a. The second thin film 112b and the getter layer 213b are disposed on the first thin film 111b. The first thin film 111c is formed to cover the second thin film 112b and the getter layer 213b. In other words, the getter layers 213a and 213b are interposed between the first thin films 111a, 111b, and 111c. Since the getter layer 213 is not disposed on the second thin films 112a and 112b, the thickness of the sealing unit 110 may be reduced thereby providing a thin organic light emitting display device 100.

The getter layer 213 may be generally comprise getter materials that react with moisture and oxygen, thereby preventing or reducing moisture and oxygen penetration into the organic light emitting unit 102. The getter layer 213 may comprise metals such as Ba, Ca, Ti, Sr, and Ce, and/or metal oxides such as BaO and CaO.

The getter layers 213a and 213b are interposed between the first thin films 111a, 111b, and 111c and react with any oxygen or moisture that penetrates past the first thin films 111a, 111b, and 111c, protecting the organic light emitting unit 102 from oxygen or moisture, thereby increasing the life of the organic light emitting display device 200.

The getter layers 213a and 213b may be formed by any suitable method for forming a thin film, for example, sputtering, CVD, PECVD, PECVD, metal organic chemical vapor deposition (MOCVD), evaporation, atomic layer deposition (ALD), and/or thermal chemical vapor deposition polymer film (TCVDPF).

When the getter layers 213a and 213b are formed using the above method, the getter layers 213a and 213b may be formed by using one shadow mask. In other words, one patterned shadow mask is used to form the plurality of the getter layers 213a and 213b on the first thin films 111a and 111b, instead of forming on a region corresponding to the upper portion of the second thin film 112.

As described above, since the plurality of the first thin films 111a, 111b, and 111c, the plurality of the second thin films 112a and 112b, and the plurality of the getter layers 213a and 213b are respectively formed by using one shadow mask, the sealing unit 110 comprising the plurality of the thin films may be formed using a total of three shadow masks and thus a manufacturing cost of the organic light emitting display device 200 may be reduced.

Embodiments of the organic light emitting display device prevent or reduce infiltration of external moisture or oxygen therein.

While certain embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light emitting display device comprising:
   a substrate;
   an organic light emitting unit disposed on the substrate;
   a sealing unit disposed over the organic light emitting unit and at least a portion of the substrate, thereby sealing the organic light emitting unit therein, wherein the sealing unit comprises at least one first thin film and at least one second thin film alternately stacked, the first thin film encapsulating the second thin film; and
   a getter layer disposed on the at least one first thin film, wherein the getter layer is substantially not disposed over the organic light emitting unit.

2. The device of claim 1, wherein the at least one first thin film is wider than the at least one second thin film.

3. The device of claim 1, comprising a plurality of stacked first thin films, wherein each of the stacked first thin films has substantially the same width.

4. The device of claim 3, comprising a plurality of stacked second thin films, wherein each of the stacked second thin films has substantially the same width.

5. The device of claim 1, wherein the at least one first thin film comprises an inorganic material.

6. The device of claim 1, wherein the at least one second thin film comprises an organic material.

7. The device of claim 1, wherein the getter layer comprises a reactive metal.

8. The device of claim 1, wherein the getter layer comprises metal oxide.

9. The device of claim 1, wherein the at least one first thin film is wider than the at least one second thin film.

10. The device of claim 1, comprising a plurality of stacked first thin films, wherein each of the stacked first thin films has substantially the same width.

11. The device of claim 10, comprising a plurality of stacked second thin films, wherein each of the stacked second thin films has substantially the same width.

12. The device of claim 1, wherein the at least one first thin film comprises an inorganic material.

13. The device of claim 1, wherein the at least one second thin films comprises an organic material.

* * * * *